United States Patent
Belot et al.

(10) Patent No.: US 6,882,194 B2
(45) Date of Patent: Apr. 19, 2005

(54) CLASS AB DIFFERENTIAL MIXER

(75) Inventors: Didier Belot, Rives (FR); Pascal Persechini, Saint Ismier (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/367,195

(22) Filed: Feb. 14, 2003

(65) Prior Publication Data

US 2003/0155959 A1 Aug. 21, 2003

(30) Foreign Application Priority Data

Feb. 15, 2002 (FR) .............................. 02 01937

(51) Int. Cl.[7] .................................. G06G 7/12
(52) U.S. Cl. .................. 327/159; 327/355; 455/333 G
(58) Field of Search .............................. 327/355–359; 455/326, 333

(56) References Cited

U.S. PATENT DOCUMENTS

| | | | | |
|---|---|---|---|---|
| 5,444,648 A | * | 8/1995 | Kimura ................ | 708/835 |
| 5,483,696 A | * | 1/1996 | Wheatley et al. .......... | 455/318 |
| 5,570,008 A | * | 10/1996 | Goetz ................. | 323/315 |
| 5,721,505 A | * | 2/1998 | Tsuchiya ................ | 327/280 |
| 5,826,182 A | * | 10/1998 | Gilbert ................ | 455/326 |
| 6,057,714 A | * | 5/2000 | Andrys et al. ............ | 327/105 |
| 6,122,497 A | | 9/2000 | Gilbert ................. | 455/333 |
| 6,134,452 A | * | 10/2000 | Hufford et al. .......... | 455/552.1 |
| 6,144,846 A | * | 11/2000 | Durec .................. | 455/323 |
| 6,205,325 B1 | * | 3/2001 | Groe ................... | 455/333 |

FOREIGN PATENT DOCUMENTS

| | | | |
|---|---|---|---|
| EP | 0565299 | * | 3/1993 |
| EP | 0 714 163 A1 | | 5/1996 |
| EP | 0 859 461 A1 | | 8/1996 |
| GB | 2 291 753 A | | 1/1996 |

OTHER PUBLICATIONS

French Search Report from priority application No. 0201937.

* cited by examiner

Primary Examiner—Dinh T. Le
(74) Attorney, Agent, or Firm—Lisa K. Jorgenson; James H. Morris; Wolf, Greenfield & Sacks, P.C.

(57) ABSTRACT

A differential mixer including at least two input/output stages, each stage including two identical branches, each branch of one of the two stages including at least two bipolar transistors the bases of which define a first pair of input/output terminals of the stage and are connected to a same D.C. current source individually by a respective isolating resistor; the collectors of which define a second pair of input/output terminals of the stage which forms a pair of input/output terminals of another stage of the mixer; and the emitters of which are individually connected to a low voltage reference line by a respective degenerative impedance.

17 Claims, 3 Drawing Sheets

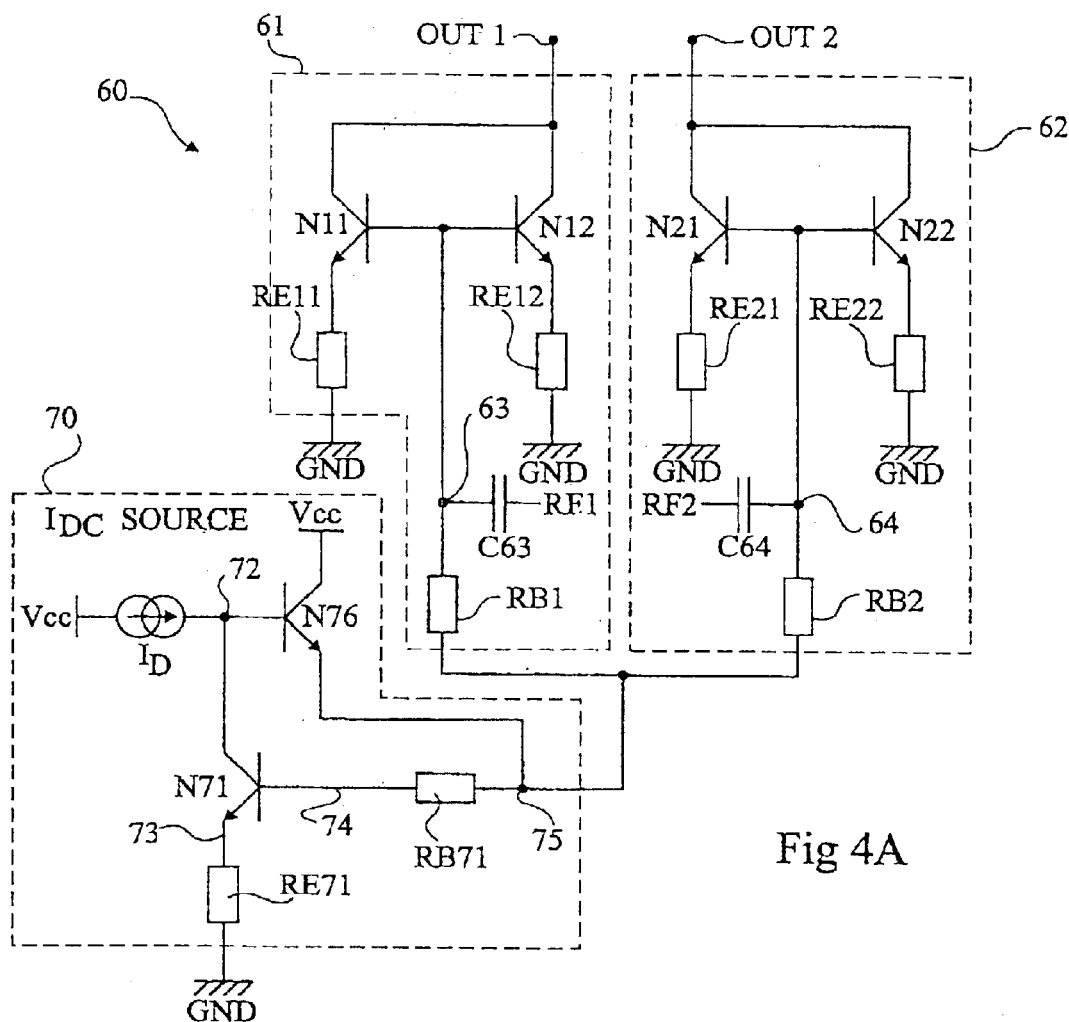
Fig 4A
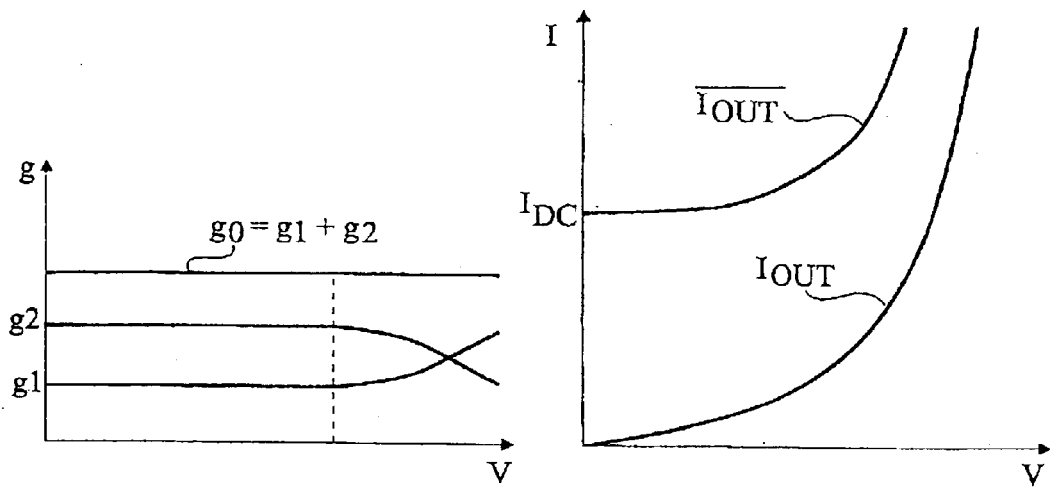
Fig 4B
Fig 4C

CLASS AB DIFFERENTIAL MIXER

BACKGROUND OF THE INVENTION

1. Field of the Invention

The present invention generally relates to the field of mixers. More specifically, the present invention relates to differential mixers.

2. Discussion of the Related Art

Such mixers are used in many applications, for example, transmission/reception chains of portable phones. In the present description, chains capable of being usable in a multimode fashion, that is, capable of receiving signals exhibiting different frequency characteristics, will be considered. Thus, a chain in the sense of the present invention will be capable of receiving at least two different signals chosen from among signals of UMTS or WCDMA standard of a frequency on the order of 2.16 Hz, of GSM standard of a frequency on the order of 900 MHz, or of DCS standard of a frequency of 1.8 GHz.

FIG. 1 schematically illustrates the functional structure of a portion of a receive chain.

The chain includes an input block 1 (RF LNA) for receiving a radiofrequency signal and including as many low-noise amplifiers 2 as there are possible modes of the input signal, three in the considered case. Each low-noise amplifier 2 is associated with a selection switch 3. The control of switches 3 is performed by a common control circuit (not shown). The amplified radiofrequency signal RF coming out of block 1 is mixed by a mixer 4 with a local oscillator signal LO to provide a signal of intermediate frequency IF. The structure of mixer 4 will be described in detail hereinafter. Then, the signal of intermediate frequency IF is filtered by a block 5 (IF FILTER). In a multimode system, several parallel filtering branches are provided, each corresponding to at least one of the possible modes. In the considered case, it is possible to only use two filtering branches, a first branch performing a filtering at a frequency of 2 MHz for signals of UMTS or WCDMA standard and a branch at 200 kHz for signals of GSM or DCS standard. Each filtering branch includes an input selection switch 6 associated with a filtering block 7. The selection of the active branch is performed by an appropriate control of the input selection switches 6, performed by the same control circuit as the selection switches 3 of input block 1. Finally, the reception chain includes a conversion block 8 (IF CONV) including as many coding branches, here, two, as block 6 includes filtering branches. Each branch of conversion block 8 includes an input switch 9 and an analog-to-digital converter 10. Converters 10 code over eight or twelve bits according to the standard used, respectively, GSM/DCS or UMTS/WCDMA. The selection of the active branch of conversion block 8 is performed in the same way as the selection of the active branch of filtering block 6.

Mixer block 4 should ideally be formed of a single multimode mixer. In practice, as will be detailed hereafter, several different mixing blocks 4 each corresponding to at least one mode to be processed must however be used. Thus, in the considered case of radiofrequency signals of standards GSM, DCS, UMTS, or WCDMA, at least two mixers are used. A first mixer processes the signals of mode GSM or DCS, and a second mixer processes the signals of standard UMTS or WCDMA. Generally, because of constraints of local oscillator LO, two separate mixers are used to process the signals of GSM mode and of DCS mode, which imposes the use of three separate mixers for the entire chain. To form each of the mixers, either a single-input mixer, associated with relatively complex common mode rejection circuits, or differential mixers, are used to automatically reject at least the common modes of even order.

FIG. 2A schematically illustrates the structure of a so-called Gilbert amplifier differential mixer. Such an amplifier includes, between two respectively high and low or reference voltage supply rails Vcc and GND, two input/output stages 20 and 30.

A first stage 20 (RF IN/OUT), hereafter the transconductance stage, receives the radiofrequency signal amplified by block 1 of FIG. 1. More specifically, input signal RF is provided to transconductance stage 20 in the form of two signals RF1 and RF2, one of which corresponds to the direct signal RF, the other one corresponding to signal RF shifted in phase by 180°. Each input signal RF1, RF2 is provided to a respective branch 21, 22 of transconductance stage 20. Each branch 21, 22 includes a respective NPN-type bipolar transistor 23, 24. The respective bases of transistors 23 and 24 form a first pair of input/output terminals of stage 20. Each input/output terminal receives, through a respective capacitor Cin1, Cin2, a single one of signals RF1 or RF2. The collectors of transistors 23 and 24 form a second pair of input/output terminals OUT1 and OUT2 of transconductance stage 20. The emitter of each transistor 23, 24 is connected, by a respective resistor R1, R2, to a first terminal of a source 25 of a D.C. current $I_{DC}$ (foot current) having its second terminal connected to reference power supply GND.

Second stage 30 (IF IN/OUT) includes a current-to-voltage conversion and filtering stage 31 and a switching stage 32. The second pair of input/output terminals OUT1/OUT2 of stage 20 also forms a pair of input/output terminals of switching stage 32. Terminal OUT1 is connected to a common emitter point of a first pair of NPN-type bipolar transistors 33 and 34. Terminal OUT2 is connected to the common emitter point of a second pair of identical NPN-type bipolar transistors 35 and 36. The bases of transistors 33 and 35 are interconnected and receive an oscillating signal LO1. The bases of transistors 34 and 36 are interconnected and receive another oscillating signal LO2. Signals LO1 and LO2 are at the frequency of local oscillator LO (FIG. 1), but phase-shifted by 180° with respect to each other.

The collectors of transistors 33 and 36 are interconnected. The collectors of transistors 34 and 35 are interconnected. The two obtained common points form a second pair of input/output terminals IF1, IF2 of second stage 30. The second pair of input/output terminals IF1, IF2 provides IF signal (FIG. 1) in the form of two signal phase-shifted by 180° with respect to each other. Each one of terminals IF1, IF2 is connected to high power supply Vcc through a respective branch of the current-to-voltage conversion and filtering stage 31 formed by the putting in parallel of a respective resistor R3, R4 and of a respective capacitor C3, C4. Resistors R3, R4 convert the output current of each branch into a voltage signal, of which respective capacitor C3, C4 filters the upper frequencies at the frequency of output signal IF1, IF2.

FIGS. 2B and 2C respectively illustrate characteristics of gain G and of current 1 versus the level of input voltage V in the mixer of FIG. 2A. The mixer gain is proportional to the product of gain Gm of transconductance stage 20 by input radiofrequency voltage $V_{RF}$. The current of output signal $I_{IF}$ is equal to the sum of a static component equal to value $I_{DC}$ of D.C. current source 25, and of a dynamic component. The current of output signal $I_{IF}$ is limited by static component $I_{DC}$. Under low supply voltages Vcc, the resulting mixer is then non-linear and output signal IF undergoes, with respect to input signal RF, a compression. This only slightly affects the processing of a signal of GSM or DCS standard in which, for a given power, the wanted data are coded in the signal by a phase modulation, the information about the signal amplitude being of no incidence. However, for signals of standard WCDMA, a given power envelope will include several messages corresponding to different power levels. The non-linearity of a Gilbert mixer then causes a loss of information.

To overcome this problem and to enable multimode operation, class AB mixers are used to process messages of standard WCDMA or UMTS.

The operating principles of a class AB mixer will be discussed hereafter in relation with FIG. 3A which illustrates the structure of a class AB amplifier and FIGS. 3B and 3C, homologous to FIGS. 2B and 2C, which illustrate the gain and output current characteristics according to the input voltage.

As illustrated in FIG. 3A, a class AB transconductance is essentially formed of a bipolar transistor 40 having its base forming an input/output terminal, receiving a radiofrequency signal $I_{IN}$, having its collector forming an output terminal of a current $I_{OUT}$, and having a degenerated emitter, that is, an emitter connected to reference power supply GND by an impedance 41. The radiofrequency signal is generally decoupled by a capacitor 42. Further, the base is connected to a bias source 43 by a resistor 44.

Such a transconductance exhibits an exponential characteristic of the gain according to the input base-emitter voltage, illustrated in FIG. 3B. This enables, as illustrated in FIG. 3C, obtaining an output current signal $I_{OUT}$ which varies exponentially as a function of the input signal, while a resistive base/emitter feedback causes no compression of the input signal, due to an increase in the static current. More specifically, the class AB transconductance exhibits a mean (static) current $\overline{I_{OUT}}$ which varies along with the input signal amplitude. If the base-emitter feedback is not very resistive, such a mean current causes no compression of the voltage difference Vbe between the base and the emitter. The dynamic component of output signal current $I_{OUT}$ is then no longer limited by bias signal $I_{DC}$ provided by source 25 but follows, or even exceeds, the mean current.

However, such a circuit samples, in the presence of a high input signal, a relatively high static current from the power supply. This is particularly disadvantageous in portable devices such as telephones or computers, since it requires frequent recharges of the device batteries. Further, such an assembly poses common mode rejection problems. The practical forming of the complete mixer, associating a first class AB non-differential transconductance stage of FIG. 3A with a second differential switching stage, is described for example in article "A class AB Monolithic Mixer for 900 MHz Applications" by K. L. Fong, C. D. Hull, and R. G. Meyer, published in IEEE Journal of Solid State Circuits, volume 32, N°8, August 1997, which is incorporated herein by reference.

SUMMARY OF THE INVENTION

The present invention accordingly aims at providing a differential mixer operating in class AB with a low power consumption.

The present invention aims at providing such a mixer which is usable in multimode applications.

The present invention aims at providing such a mixer which automatically adjusts an A-type or AB-type operation.

The present invention aims at providing such a mixer which automatically adjusts its power consumption level to the activated mode.

The present invention aims at providing such a mixer which exhibits a reduced bulk.

The present invention aims at providing such a mixer which automatically rejects common modes.

To achieve these and other objects, the present invention provides a differential mixer including at least two input/output stages, each stage including two identical branches, each branch of one of the two stages including at least two bipolar transistors the bases of which define a first pair of input/output terminals of the stage and are connected to a same D.C. current source individually by a respective isolating resistor;

the collectors of which define a second pair of input/output terminals of the stage which forms a pair of input/output terminals of another stage of the mixer; and the emitters of which are individually connected to a low voltage reference line by a respective degenerative impedance.

According to an embodiment of the present invention, for a given branch, the surface area ratios of the bipolar transistors, the value of the respective isolation resistor and the values of the respective degenerative impedances are selected so that the equivalent transconductances associated with each transistor of the considered branch are different, and so that to each value of the equivalent transconductance associated with a transistor of one of the branches corresponds an equivalent transconductance associated with a transistor of the other one of the branches of same value.

According to an embodiment of the present invention, the ratios of the isolating resistance to the value of the degenerative impedance of the transistors of a given branch are different.

According to an embodiment of the present invention, said at least two bipolar transistors of each branch are of same dimensions.

According to an embodiment of the present invention, said at least two bipolar transistors of each branch are of different dimensions.

According to an embodiment of the present invention, the degenerative impedance interposed between the emitter of each of the transistors and the voltage reference line is a respective resistor.

According to an embodiment of the present invention, the emitters of said at least two bipolar transistors of each of the branches exhibit different surface areas and are directly connected to the voltage reference line.

According to an embodiment of the present invention, the D.C. current source is formed by the connection, between a high supply line and the low voltage reference line, of a D.C. current source, of a first bipolar transistor of a given type, the junction point of the current source and of the first transistor being connected to the base of a second bipolar transistor of same type as the first transistor, a collector-emitter terminal of which is connected to the high supply line, and an emitter/collector terminal of which is connected to the base of the first transistor and forms the output of the current source.

The present invention also provides a radiofrequency signal transmit/receive chain, including a mixer according to any of the preceding embodiments, each branch of the first state being provided to receive/transmit a radiofrequency signal phase-shifted by 180° with respect to the radiofrequency signal received/transmitted by the other branch, and each branch of the second stage being intended to transmit/receive a signal of intermediate frequency phase-shifted by 180° with respect to the intermediate frequency signal transmitted/received by the other branch.

According to an embodiment of the present invention, the radiofrequency and intermediate frequency signals may be of any frequency standard chosen from among standards UMTS, WCDMA, GSM, or DCS.

The present invention also provides a differential mixer, comprising a first stage comprising two bipolar transistors, each bipolar transistor having a base, the bases interconnected to form a first terminal of the first stage, each bipolar transistor having a collector, the collectors interconnected to form a second terminal of the first stage.

According to an embodiment of the present invention, the differential mixer further comprising a D.C. current source connected to the first terminal through a resistance.

According to another embodiment of the present invention, the differential mixer wherein each of the two bipolar transistors has an emitter connected to a reference voltage through a respective degenerative impedance.

According to another embodiment of the present invention, the differential mixer wherein a first combination of a first of the two bipolar transistors and its respective degenerative impedance is operative to exhibit a first transconductance, and wherein a second combination of a second of the two bipolar transistors and its respective degenerative impedance is operative to exhibit a second transconductance different than the first transconductance.

According to another embodiment of the present invention, the differential mixer wherein the two bipolar transistors are part of a first branch of the first stage, the first stage further comprising a second branch comprising two additional bipolar transistors, each additional bipolar transistor having a base, the bases of the additional bipolar transistors interconnected to form a third terminal of the first stage, each additional bipolar transistor having a collector, the collectors of the additional bipolar transistors interconnected to form a fourth terminal of the first stage.

According to another embodiment of the present invention, the differential mixer wherein the D.C. current source is connected to the third terminal through a resistance.

The present invention also provides a differential mixer, comprising a D.C. current source; and a differential stage including a first pair of terminals connected to the D.C. current source and operative to receive electromagnetic signals, and including a second pair of terminals, wherein the mixer is operative to automatically switch from a first mode of mixing to a second mode of mixing different than the first mode.

According to an embodiment of the present invention, the differential mixer of further comprising means for automatically switching from the first mixing mode to the second mixing mode.

According to another embodiment of the present invention, the differential mixer wherein the mixer is operative to automatically switch from the first mixing mode to the second mixing mode in response to change in a value of the received electromagnetic signal.

According to another embodiment of the present invention, the differential mixer wherein the first mixing mode is either a class A mixing mode or a class AB mixing mode and the second mixing mode is either a class AB mixing mode or a class A mixing mode.

The present invention also provides a method of mixing, comprising acts of (A) receiving a first electromagnetic signal; (B) mixing the first electromagnetic signal according to a first mixing mode; (C) receiving a second electromagnetic signal; (D) automatically switching from the first mixing mode to a second mixing mode different than the first mixing mode; and (E) mixing the second electromagnetic signal according to the second mixing mode.

According to an embodiment of the present invention, the differential mixer wherein act (D) includes automatically switching from the first mixing mode to the second mixing mode in response to a value of the second electromagnetic signal.

According to another embodiment of the present invention, the differential mixer wherein the first mixing mode is either a class A mixing mode or a class AB mixing mode and the second mixing mode is either a class AB mixing mode or a class A mixing mode.

The foregoing objects, features and advantages of the present invention will be discussed in detail in the following non-limiting description of specific embodiments in connection with the accompanying drawings.

BRIEF DESCRIPTION OF THE DRAWINGS

FIG. 4A schematically illustrates the structure of an input/output stage of a symmetrical differential class AB transconductor according to the present invention;

FIG. 4B illustrates a characteristic of the transconductance gain versus an input voltage of the input/output stage of FIG. 4A; and FIG. 4C illustrates a characteristic of the output current versus the input voltage of the input/output stage of FIG. 4A.

DETAILED DESCRIPTION

Figure 1:
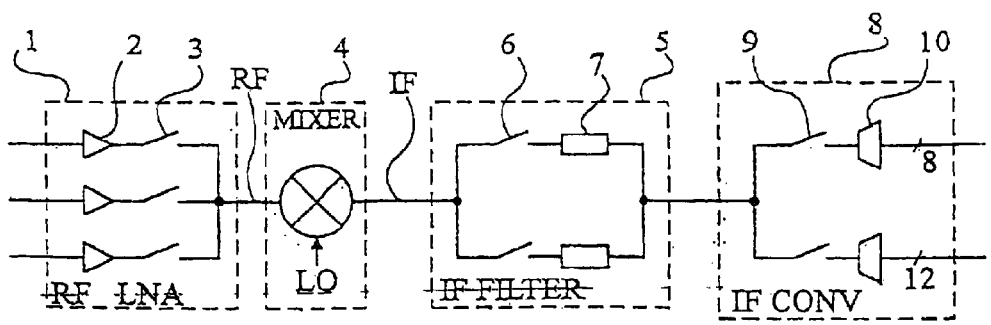
FIG. 1, previously described, schematically illustrates the architecture of a transmit/receive chain.

Only those elements necessary to the understanding of the present invention have been shown and will be described hereafter. Further, same elements have been designated with same references in the different drawings. Moreover, the characteristics of FIGS. 2B, 2C, 3B, 3C, 4B and 4C are not drawn to scale.

FIG. 4A schematically shows the structure of a first input/output stage 60 of a symmetrical differential class AB transconductor according to the present invention. For clarity, it is considered hereafter that the complete differential mixer includes a second stage (not shown) similar to stage 30 of FIG. 2A.

Stage 60 is a differential stage including two branches 61 and 62.

Branch 61 includes at least two bipolar transistors N11, N12 of the same type, for example, NPN. The bases of transistors N11 and N12 are interconnected at a common point 63. Common base 63 forms an input/output terminal receiving an input signal RF1, for example, a radiofrequency signal. Preferably, input signal RF1 is decoupled by a capacitor C63. Common base 63 is further connected to a D.C. current source 70 (SOURCE) by an isolation resistor RB1. The collectors of transistors N11 and N12 are interconnected and form an output/input terminal OUT1. Terminal OUT1 is homologous to terminal OUT1 of FIG. 2A and is also used as an input/output terminal of the second stage of the complete mixer. The emitters of transistors N11 and N12 are individually connected to a voltage reference line GND by a respective degenerative impedance exhibiting a resistive and possibly inductive character. For clarity, the degenerative impedance is assumed to be a resistor RE11, RE12 interposed between reference line GND and the emitter of transistor N11, N12, respectively.

Similarly, branch 62 includes two transistors N21 and N22. Transistors N21 and N22 are of the same type as transistors N11 and N12 of branch 61. The bases of transistors N21 and N22 are interconnected and form an input/output terminal 64, while their interconnected collectors form an output/input terminal OUT2. Input/output terminal 64 is connected to the same D.C. current source 70 (SOURCE) as input/output terminal 63 of branch 61 by a respective isolating resistor RB2. The emitters of transistors N21 and N22 are individually connected to reference line GND by a respective inductive or, for example, resistive, degenerative impedance RE21, RE22. The choice of the values of the various isolating resistors RB1, RB2 and of resistive impedances RE11, RE12, RE21 and RE22 will be described hereafter.

Input signals RF1 and RF2 of branches 61 and 62 are phase-shifted by 180° with respect to each other. Further, one of signals RF1 or RF2 corresponds to the direct input signal of the mixer in a transmission chain for example similar to that of FIG. 1.

FIG. 4A illustrates a possible embodiment of D.C. current source 70 (SOURCE). Source 70 includes, interposed between a high voltage supply line Vcc and reference line GND, a current source $I_D$ and an NPN-type bipolar transistor N71. Transistor N71 is connected to source $I_D$ by its collector 72 and to reference line GND by its emitter 73. A resistor RE71 is interposed between emitter 73 and reference GND. The base of transistor N71 is connected to a first terminal 74 of an isolating resistor RB71. A second terminal 75 of isolating resistor RB71 is connected to each of bases 63, 64 by its respective isolating resistor RB1, RB2. Source 70 further includes an NPN-type bipolar transistor N76 having its base connected to collector 72, and thus also to source $I_D$, having its emitter connected to second terminal 75 of isolating resistor RB71, and having its collector connected to high power supply Vcc. Such a source provides a D.C. current with a level which is variable, substantially from the level of the current provided by source $I_D$, directly sampling from voltage supply Vcc-GND of the circuit. Such a variation automatically adjusts to the needs of the device connected to output terminal 75 of source 70, that is, of branches 61 and 62.

For each differential branch 61 and 62, the dimensions of transistors N11, N12, N21, and N22 as well as the values of the different isolating resistances RB1, RB2, and of degenerative impedances RE11, RE12, RE21, and RE22 are selected according to the following constraints.

First, the two branches 61 and 62 of differential stage 60 must exhibit identical general characteristics.

Then, for each branch, isolating resistor RB1, RB2 must exhibit a sufficiently high value to guarantee the isolation of the D.C. current source with respect to the variations of input signal RF1, RF2. Indeed, if isolating resistor RB1, RB2 is too small, the possible noise of source 70 will reach common base 63, 64. Each isolating resistor RB1, RB2 must however be sufficiently small to enable flowing of the D.C. current necessary to bias transistors N11 and N12, N21 and N22. For example, for the power levels of the various possible input signals of standards GSM, DCS, UMTS, or WCDMA, isolating resistance RB1, RB2 ranges between 0.4 and 1.5 kΩ.

Further, each differential branch 61 and 62 must include two distinct transconductances and to each transconductance of branch 61 must correspond a transconductance of same value in branch 62. Given an application, that is, values of the bias current and of isolating resistance RB1, RB2, the transconductances depend on the dimensions of transistors N11, N12, N21, and N22 and on the values of degenerative impedances RE11, RE12, RE21, and RE22.

According to an embodiment, the surface area ratios of transistors N11 and N12 or N21 and N22 of a given branch 61 or 62 are identical and different transconductances are obtained by varying ratios RB1/RE11, RB1/RE12, RB2/RE21 or RB2/RE22 of the value of isolating resistance RB1 or RB2 to the value of degenerative resistance RE11, RE12, RE21, or RE22.

According to another embodiment, the surface area ratios of transistors N11 and N12 or N21 and N22 of a given branch 61 or 62 are different. The values of the degenerative impedances may then be equal or chosen to be different to obtain different transconductances.

According to an embodiment, from one branch to the other, the surface area ratios of transistors N11, N12, and N21, N22 as well as the values of the degenerative impedances are different, but chosen so that to each transconductance of branch 61 corresponds a transconductance of same value in branch 62.

Preferably, branch 62 is strictly identical to branch 61, that is, to each transistor N11, N12 associated with an impedance RE11, RE12 of branch 61 corresponds in branch 62 a transistor of same dimensions associated with an impedance RE21, RE22 of same value as impedance RE11, RE12 associated with the homologous transistor of branch 61. Then, isolating resistances RB1 and RB2 also have, preferably, equal values.

Other constraints for the choice of the values of the different transconductances will be indicated hereafter.

In a given application, the determination of the equivalent transconductance values of a branch 61, 62 to be used, which depends on the surface area ratio of transistors N11 and N12 or N21 and N22, on the value of emitter resistances RE11, RE12, RE21, and RE22, and on bias current $I_{DC}$, is performed to enable rejection of the common modes of odd order. An analytic expression of this transconductance can be determined, for example, by so-called Volterra developments.

Figure 2B:
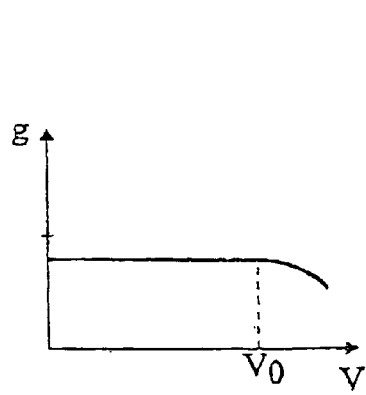
FIGS. 2B and 2C, previously described, illustrate characteristics of an input/output stage of the mixer of FIG. 2A.
Figure 2C:
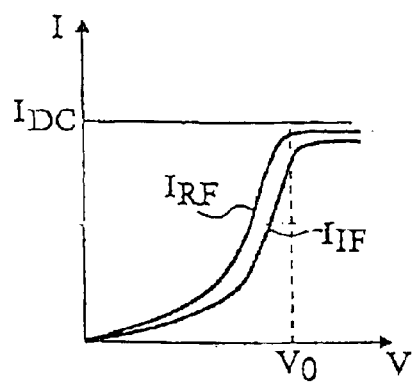
Figure 3A:
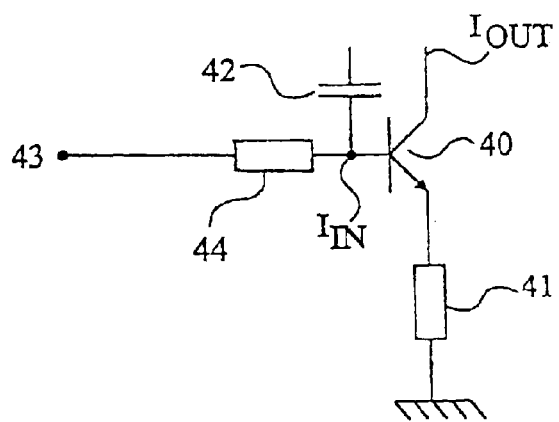
FIG. 3A, previously described, shows the circuit diagram of a known class AB transconductance stage of a mixer.
Figure 3B:
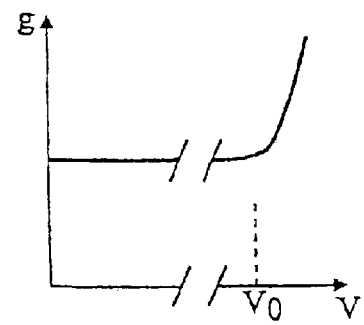
FIGS. 3B and 3C, previously described, illustrate characteristics of the transconductance stage of FIG. 3A.
Figure 3C:
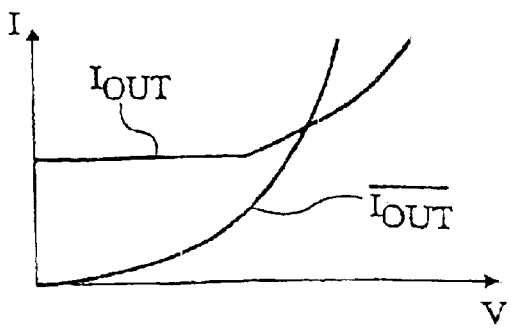

The behavior of an input/output stage of a differential mixer according to the present invention will be described hereafter in relation with FIGS. 4B and 4C. FIG. 4B, which is to be compared with FIGS. 2B and 3B, illustrates gain g of the stage according to input/output voltage V. FIG. 4C, which should be compared with FIGS. 2C and 3C, illustrates the variations of output dynamic and static currents $I_{OUT}$ and $\overline{I_{OUT}}$, respectively, of the complete mixer as a function of the same input voltage.

For clarity, it is considered that the stage according to the present invention is made as described in relation with FIG. 4A. In this case, the considered input voltage V is the base-emitter voltage applied across transistor pairs N11, N12 and N21, N22 of each branch 61 and 62. For small signals, the gain of a branch 61 remains constant at a value $g_0$. However, each transconductance of the considered branch 61 associated with transistors N11, N12 exhibits a specific gain $g_1$, $g_2$ characteristic of a class AB stage. Beyond a given threshold $V_0$, each gain $g_1$, $g_2$ varies. For example, gain $g_1$ of the transconductance associated with transistor N11 starts increasing from threshold $V_0$ while gain $g_2$ of the transconductance associated with transistor N12 tends to decrease.

For small input signals, the mixer then exhibits a class A behavior. Dynamic output signal $I_{OUT}$ varies according to the input signal while static or mean current $\overline{I_{OUT}}$ sampled from the power supply remains substantially constant, at minimum value $I_{DC}$ provided by source 70. Beyond a given input power, the mixer automatically adopts a class AB behavior. Dynamic output current $I_{OUT}$ and static current $\overline{I_{OUT}}$ sampled from the power supply vary according to the input signal.

The adjusting of the level of bias current $I_{DC}$ which determines the minimum value of mean current $\overline{I_{OUT}}$ is limited to the circuit needs and is performed by source 70. This is particularly advantageous as compared to known mixers which require high power levels.

Further, as compared to known mixers, the mixer according to the present invention advantageously has a greater input power range. Indeed, known assemblies could not process input signals for which the input voltage V would exceed threshold $V_0$.

The input/output stage according to the present invention further has the advantage of avoiding use of common mode devices of even as well as odd order including elements, such as inductive windings, which must be integrated on a different chip. Its integration is thus eased as compared to existing devices.

The present invention thus advantageously provides a differential mixer capable of automatically switching from a class A operation to a class AB operation and conversely according to the input signal.

Such a stage is thus advantageously usable as an input stage whatever the standard of the input signal. A signal input stage can thus be used in multimode applications. It is no longer necessary to manufacture dedicated stages specific to an operating mode, that is, to provide as many specific manufacturing processes as there are modes.

Figure 2A:
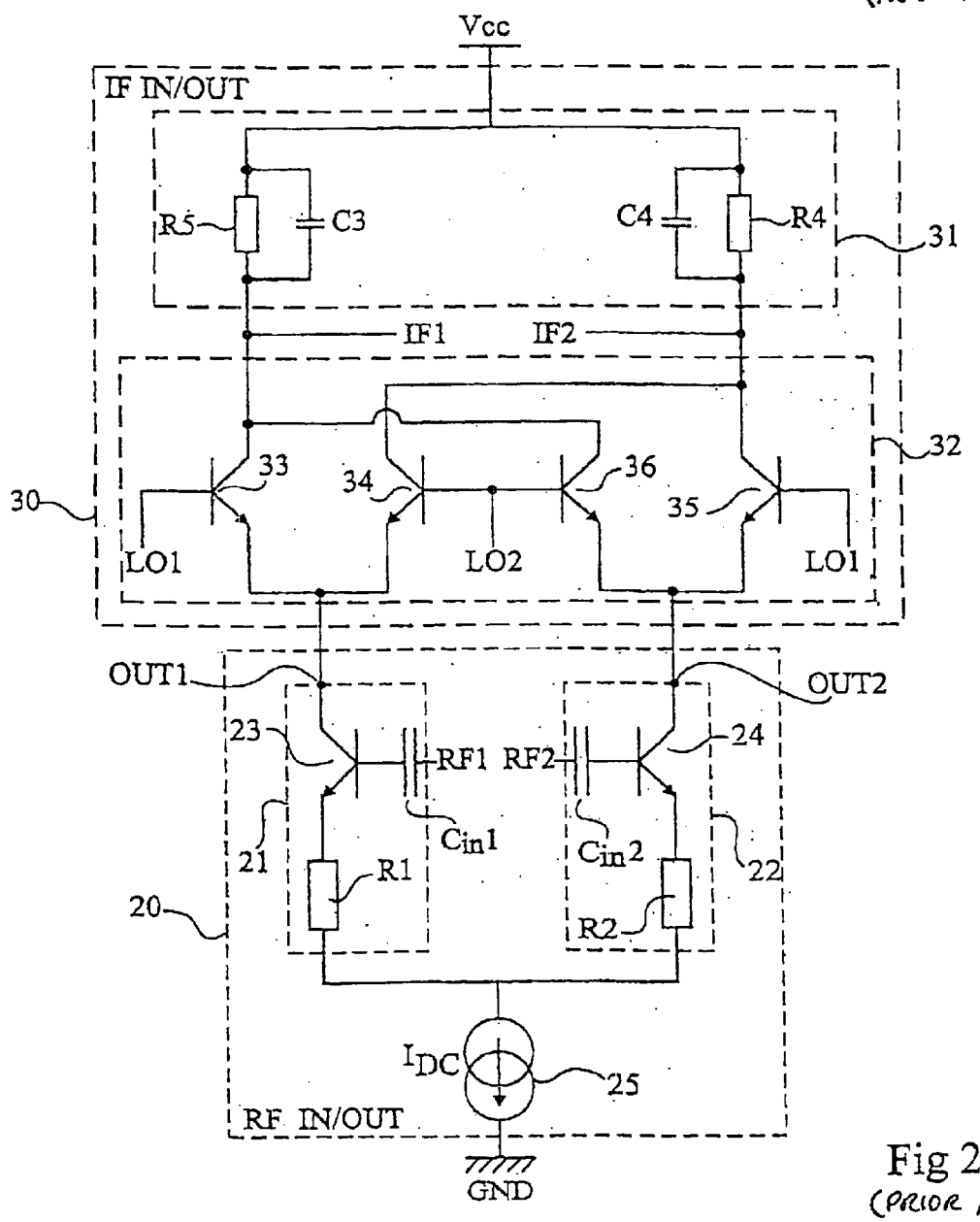
FIG. 2A, previously described, shows a conventional Gilbert differential mixer.

Further, in a complete mixer including a second input/output stage similar to stage 30 of FIG. 2A, from one mode to the other, the only element to be modified is the local oscillator which is formed outside of the mixing circuit. Those skilled in the art will be able to provide as many oscillating circuits as necessary and the selection of the appropriate circuit. For example, for a transmission chain similar to that of FIG. 1, such a selection can be performed by the same control circuit as the selection of the active filtering or conversion branches.

The present invention thus provides a multimode mixer which adapts automatically to the mode used.

Further, the power consumption is advantageously automatically adjusted and limited to its needs according to the operating mode.

Moreover, the mixer according to the present invention exhibits, according to tests performed by the applicant, a better linearity than existing mixers over a greater input power range.

Further, such an improvement in performance—power consumption reduction and better linearity—is obtained with a more easily integrable circuit.

Of course, the present invention is likely to have various alterations, modifications, and improvements which will readily occur to those skilled in the art. In particular, the present invention has been described in the case of differential branches including two transistors, that is, two distinct transconductances. However, it is possible to increase the number of transistors of each branch, provided that the two branches remain symmetrical. Further, it has been assumed in the foregoing description that the degenerative impedance of the emitter of each transistor of the transconductance branches is resistive. However, it may also exhibit an inductive character or be exclusively inductive.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A differential mixer including at least two input/output stages, at least a first of the two input/output stages including two identical branches, wherein each branch includes at least two bipolar transistors, bases of the two bipolar transistors of a first of the two identical branches connected together to define a first input/output terminal of a first pair of input/output terminals of the stage and bases of the two bipolar transistors of a second of the two identical branches connected together to define a second input/output terminal of the first pair of input/output terminals, the first and second input/output terminals being connected to a first D.C. current source individually by a respective isolating resistor; collectors of the two bipolar transistors of the first branch connected together to define a third input/output terminal of a second pair of input/output terminals of the at least one stage which forms a pair of input/output terminals of a second of the at least two stages of the mixer, collectors of the two bipolar transistors of the second branch connected together to define a fourth input/output terminal of the second pair of input/output terminals; wherein each of the emitters of the bipolar transistors of the first and second branch is individually connected to a low voltage reference line by a respective degenerative impedance; and wherein each of the first and second input/output terminals is connected to receive a respective RF input signal.

2. The mixer of claim 1, wherein, for the first branch, the surface area ratios of the two bipolar transistors, a value of the respective isolation resistor of the first branch and values of the respective degenerative impedances of the first branch are selected so that equivalent transconductances associated with the two bipolar transistors of the first branch are different, and wherein, for each bipolar transistor of the first branch, a value of the equivalent transconductance associated with the bipolar transistor corresponds to an equivalent transconductance associated with a transistor of the second branch.

3. The mixer of claim 2, wherein, a ratio of a value of the isolating resistor of a first bipolar transistor of one of the two identical branches to a value of the degenerative impedance of the first bipolar transistor is different than a ratio of a value of the isolating resistor of a second bipolar transistor of the one branch to a value of the degenerative impedance of the second bipolar transistor.

4. The mixer of claim 2, wherein all structural dimensions of said at least two bipolar transistors of each branch are the same.

5. The mixer of claim 2, wherein at least one structural dimension of said at least two bipolar transistors of each branch is different.

6. The mixer of claim 2, wherein, for each of the two bipolar transistors of the first branch, the degenerative impedance interposed between the emitter of the bipolar transistor and the voltage reference line is a resistor.

7. The mixer of claim 1, wherein, for each of the branches, the emitters of said at least two bipolar transistors exhibit different surface areas.

8. The mixer of claim 1, wherein the first D.C. current source is formed by a connection, between a high supply line and the low voltage reference line, of a second D.C. current source, of a first bipolar transistor of a first type, a junction of the current source and of the first bipolar transistor being connected to the base of a second bipolar transistor of the first type, a terminal of which is connected to the high supply line, and a terminal of which is connected to the base of the first transistor and forms the output of the current source.

9. A radiofrequency signal transmit/receive chain, including the mixer of claim 1, and wherein each branch of the first stage receives/transmits a radiofrequency signal phase-shifted by 180° with respect to the radiofrequency signal received/transmitted by the other branch, and wherein each branch of the second stage transmits/receives a signal of intermediate frequency phase-shifted by 180° with respect to the intermediate frequency signal transmitted/received by the other branch.

10. The chain of claim 9, wherein each of the radio frequency signal and the intermediate frequency signal has a frequency within a frequency range defined by one of the following telecommunications standards: UMTS, WCDMA, GSM, or DCS.

11. A differential mixer, comprising:
a first stage comprising:
two bipolar transistors, each bipolar transistor having a base, the bases interconnected to form a first terminal of the first stage, each bipolar transistor having a collector, the collectors interconnected to form a second terminal of the first stage;
further comprising:
a D.C. current source connected to the first terminal through a resistance; and wherein the first terminal is connected to receive an RF input signal.

12. The differential mixer of claim 11, wherein each of the two bipolar transistors has an emitter connected to a reference voltage through a respective degenerative impedance.

13. The differential mixer of claim 12, wherein a first combination of a first of the two bipolar transistors and its respective degenerative impedance is operative to exhibit a first transconductance, and wherein a second combination of a second of the two bipolar transistors and its respective degenerative impedance is operative to exhibit a second transconductance different than the first transconductance.

14. A differential mixer, comprising:
a first stage comprising:
two bipolar transistors, each bipolar transistor having a base, the bases interconnected to form a first terminal of the first stage, each bipolar transistor having a collector, the collectors interconnected to form a second terminal of the first stage;

wherein the two bipolar transistors are part of a first branch of the first stage, the first stage further comprising:
a second branch comprising two additional bipolar transistors, each additional bipolar transistor having a base, the bases of the additional bipolar transistors interconnected to form a third terminal of the first stage, each additional bipolar transistor having a collector, the collectors of the additional bipolar transistors interconnected to form a fourth terminal of the first stage;
wherein a D.C. current source is connected to the first and third terminals through a resistance; and wherein each of the first and third terminals is connected to receive a respective RF input signal.

15. A differential mixer, comprising:
a D.C. current source; and
a differential stage including a first pair of terminals connected to the D.C. current source and operative to receive electromagnetic signals, and including a second pair of terminals,
wherein the mixer is operative to automatically switch from a first mode of mixing to a second mode of mixing different than the first mode;
wherein the mixer is operative to automatically switch from the first mixing mode to the second mixing mode in response to change in a value of the received electromagnetic signal; and
wherein the first mixing mode is either a class A mixing mode or a class AB mixing mode and the second mixing mode is either a class AB mixing mode or a class A mixing mode.

16. The differential mixer of claim 15, further comprising:
means for automatically switching from the first mixing mode to the second mixing mode.

17. A method of mixing, comprising acts of:
(A) receiving a first electromagnetic signal;
(B) mixing the first electromagnetic signal according to a first mixing mode;
(C) receiving a second electromagnetic signal;
(D) automatically switching from the first mixing mode to a second mixing mode different than the first mixing mode; and
(E) mixing the second electromagnetic signal according to the second mixing mode;
wherein act (D) includes automatically switching from the first mixing mode to the second mixing mode in response to a value of the second electromagnetic signal; and
wherein the first mixing mode is either a class A mixing mode or a class AB mixing mode and the second mixing mode is either a class AB mixing mode or a class A mixing mode.

* * * * *